United States Patent [19]

Kobayashi et al.

[11] 4,282,568

[45] Aug. 4, 1981

[54] ELECTRIC POWER CONVERTING APPARATUS

[75] Inventors: Sumio Kobayashi, Yokohama; Tetsushi Matsushita, Fuchu, both of Japan

[73] Assignee: Tokyo Shibaura Denki Kabushiki Kaisha, Kanagawa, Japan

[21] Appl. No.: 141,366

[22] Filed: Apr. 18, 1980

Related U.S. Application Data

[63] Continuation-in-part of Ser. No. 872,008, Jan. 24, 1978, abandoned.

[30] Foreign Application Priority Data

Jan. 26, 1977 [JP] Japan .................................. 52-7571

[51] Int. Cl.³ ............................................ H02H 7/125
[52] U.S. Cl. ........................................ 363/54; 363/68; 363/129; 361/111; 307/252 Q
[58] Field of Search .................................. 363/51–54, 363/67–70, 128, 129; 361/91, 111, 117, 118, 127; 307/252 L, 252 N, 252 Q

[56] References Cited

U.S. PATENT DOCUMENTS

| | | | |
|---|---|---|---|
| 3,246,206 | 4/1966 | Chowdhuri | 361/127 |
| 3,508,135 | 4/1970 | Dijkstra et al. | 363/129 |
| 3,662,250 | 5/1972 | Piccone et al. | 363/51 |
| 3,865,438 | 2/1975 | Boksjo et al. | 363/54 |
| 3,943,427 | 3/1976 | Tolstov et al. | 363/51 |
| 3,947,726 | 3/1976 | DeCecco et al. | 361/111 |
| 4,015,170 | 3/1977 | Barakaev et al. | 363/51 |
| 4,084,221 | 4/1978 | Ogata | 363/68 |

OTHER PUBLICATIONS

R. L. Steigerwald, "Application Techniques for High Power Gate Turn-off Thyristors", IAS 1975 ANNUAL, pp. 165-174.
G. Thiele, "Report on the Equipment of Cabora Bassa Scheme", C.I.G.R.E. Study Committee, 14 Oct., 1975, Johannesberg, 14-75(SC)02 Part 1.
E. Anwander and P. Etter, "Thyristor Converter Valves for 100 kv D.C. Bridge Voltage", Brown Boveri Rev., Feb. 1969, pp. 79-88.

Primary Examiner—William M. Shoop
Assistant Examiner—Peter S. Wong
Attorney, Agent, or Firm—Stevens, Davis, Miller & Mosher

[57] ABSTRACT

In an electric power converting apparatus comprising a plurality of branches each including a plurality of serially connected semiconductor switching elements, a non-linear resistor is connected in parallel with each semiconductor switching element, and a voltage division element including serially connected capacitor and a resistor is connected in parallel with each semiconductor switching element. A reactor is connected in series with each one of the branches and an arrestor is connected in parallel with a serially connected reactor and an associated branch.

7 Claims, 19 Drawing Figures

FIG. I
PRIOR ART
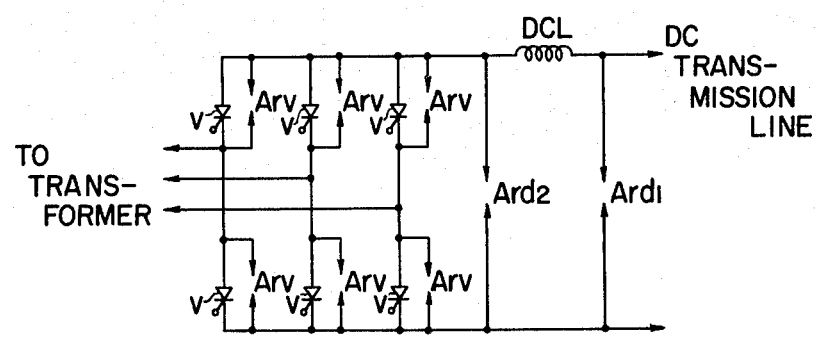
FIG. 2
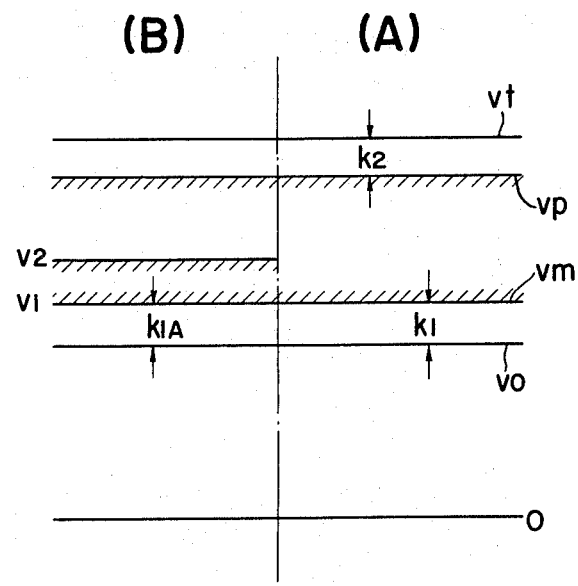

FIG. 7
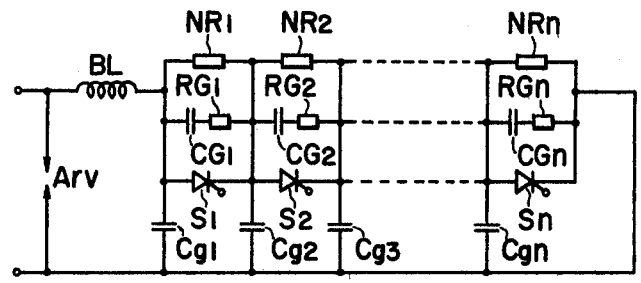
FIG. 8
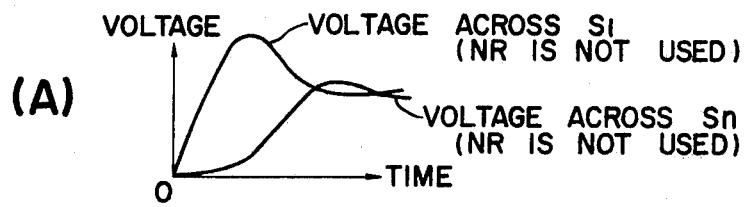
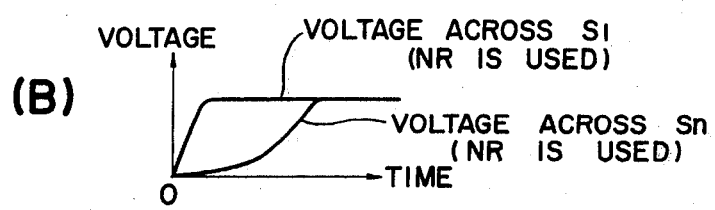
FIG. 9
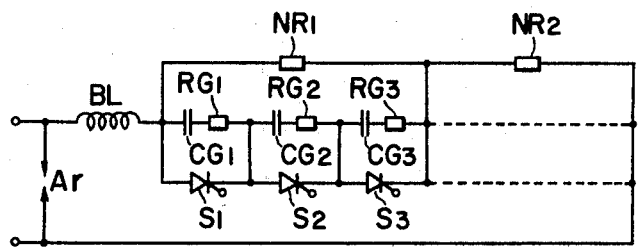

ELECTRIC POWER CONVERTING APPARATUS

CROSS-REFERENCES TO RELATED APPLICATION

This application is a continuation in part application of our U.S. Patent Application Ser. No. 872,008, filed on Jan. 24, 1978 now abandoned.

BACKGROUND OF THE INVENTION

This invention relates to an electric power converting apparatus utilizing semiconductor switching elements, typically thyristors, and power diodes.

In a conventional electric power converting apparatus, such as a rectifier or inverter, a plurality of branch circuits each comprising serially connected thyristors are connected in parallel across a DC power line to form a bridge rectifier or inverter, and a DC reactor is connected in series with the power converting apparatus. As will be described later in more detail, in the thyristor converter utilizing a number of serially connected thyristors, it is necessary to connect voltage dividing circuits across respective thyristors in order to uniformly distribute or share a surge voltage among thyristors. This structure causes many problems.

SUMMARY OF THE INVENTION

Accordingly, it is an object of this invention to provide an improved electric power converting apparatus utilizing semiconductor switching elements which is capable of obviating various problems of the prior art apparatus.

Another object of this invention is to provide an improved electric power converting apparatus capable of more uniformly distributing surge voltage among a plurality of serially connected semiconductor switching elements and decreasing the rating of anode reactors connected between semiconductor switching elements.

Still another object of this invention is to provide an improved electric power converting apparatus capable of reducing the number of semiconductor switching elements which are connected in series, and decreasing the power loss of the switching elements.

A further object of this invention is to provide an improved electric power converting apparatus utilizing semiconductor switching elements and capable of improving the reliability and decreasing the cost of the apparatus.

According to this invention these and further objects can be accomplished by providing an electric power converting apparatus comprising: a plurality of parallelly connected branches, a plurality of linear reactors each connected in series with one of the branches, and a plurality of arrestors each connected in parallel with a series connection of a linear reactor and a branch, each branch including a plurality of serially connected semiconductor switching elements, a plurality of non-linear resistors each connected in parallel with one or more of the semiconductor switching elements, a voltage division element including a serially connected capacitor and resistor connected in parallel with each semiconductor switching element and anode reactors connected in series with the semiconductor switching elements, each of the non-linear resistors of a branch providing a limiting voltage, and the sum of the limiting voltages being lower than the protective level of an arrestor connected in parallel with a serially connected linear reactor and a branch.

BRIEF DESCRIPTION OF THE DRAWINGS

In the accompanying drawings:

FIG. 1 is a connection diagram showing a typical prior art thyristor converter;

FIGS. 2A and 2B are graphs useful to explain insulation coordination;

FIG. 7 is a connection diagram showing another embodiment of the thyristor converter embodying the invention;

FIGS. 8A and 8B are graphs showing the effect of voltage share caused by the non-linear resistor;

FIGS. 9, 10 and 11 are connection diagrams showing still other modifications of this invention.

DESCRIPTION OF THE PREFERRED EMBODIMENTS

Figure 3:
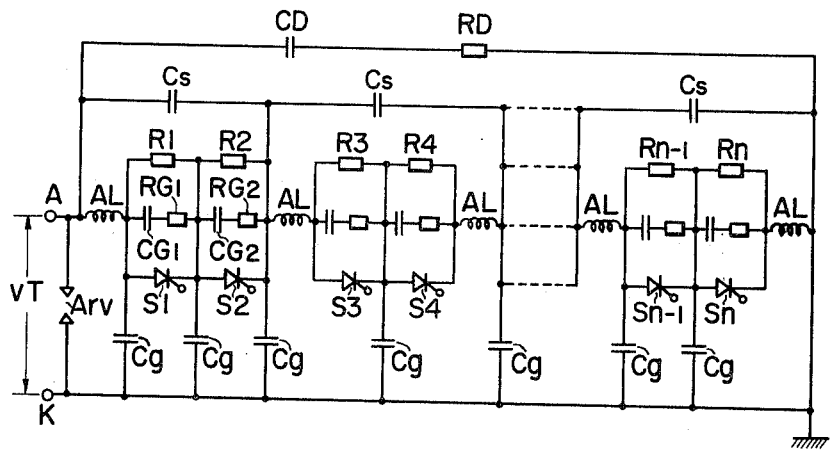
FIG. 3 is a connection diagram showing another typical prior art thyristor converter.

As shown in FIG. 1, a typical electric power converting device utilizing semiconductor switching elements, for example thyristors, power transistors, etc., comprises bridge connected semiconductor switching elements v, a DC reactor DCL connected in series with a DC transmission line, and arrestors $A_{rv}$ respectively connected in parallel with the switching elements, and other arresters $A_{rd1}$ and $A_{rd2}$ respectively connected across the DC transmission line on the output and input sides of the DC reactor. Since thyristors are used as the switching elements in most cases, in the following description the converter of the type described above is called a "thyristor converter". Due to the voltage rating of the thyristor, each switching element v is made up of a plurality of serially connected thyristors, as shown in FIG. 3. In this case, the insulation coordination of the valve is ensured by determining the test voltage vt of the thyristor valve v based on the protective level or operating voltage vp of the arrester $A_{rv}$ as shown in FIG. 2A in which rm represents the lower sparkover voltage limit at which the arrester becomes non-conductive. Each thyristor valve is designed such that a plurality of serially connected thyristors $S_1$–$S_n$ can withstand the test voltage vt. In FIG. 3, $C_{G1}$ through $C_{Gn}$, $R_{G1}$ through $R_{Gn}$ and $R_1$ through $R_n$ represent capacitors and resistors constituting voltage dividing circuits respectively connected in parallel with thyristors $S_1$ through $S_n$, and CD and RD represent a capacitor and a resistor that constitute a circuit which prevents oscillations caused by commutating current and controls the maximum operating voltage vo shown in FIG. 2A. Symbol $C_g$ represents the stray capacitance between each thyristor and ground and $C_s$ represents capacitors utilized to improve unbalance in the share of the surge voltage caused by the stray capacitances $C_g$. AL represents reactors connected in series with the thyristors for the purpose of controlling the switching power by which the thyristors are turned on and for improving the share of the surge voltage.

The number of thyristors to be connected in series is determined by the following equation 1.

$$n = \frac{vt \times ku}{v} \quad (1)$$

where v represents the permissible voltage of one thyristor and ku the coefficient of the unbalanced voltage share. Many efforts have been made in the past to reduce the value of n. It is most effective to control ku to be equal to unity. However, prior art thyristor converters have the following defects:

(1) Since capacitors $C_s$ are used for the purpose of improving the percentage of unbalance ku, the discharge currents of the capacitors $C_s$ which flow at the time of turning ON the thyristors increase the turn on stress. In order to prevent this defect it is necessary to use large reactors AL.

(2) Since use of capacitors $C_s$ increases the commutating current oscillation voltage it is necessary to increase the capacity of the capacitor CD, but this expedient increases the loss caused by resistor RD.

(3) As the thyristors are designed based on a test voltage vt having such high level that is scarcely impressed upon the thyristors in actual power systems, the number of serially connected thyristors increases which is, of course, uneconomical. If arrestors having a low protective level were available, the number of the serially connected thyristors could be decreased. However, there is a limit to this.

Figure 4:
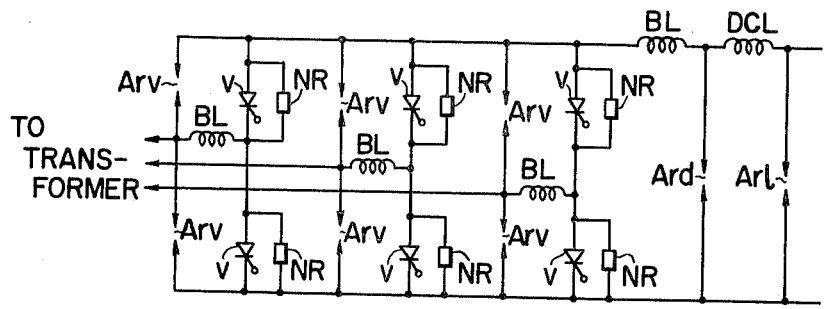
FIG. 4 is a connection diagram showing one example of the thyristor converter embodying the invention.
Figure 5:
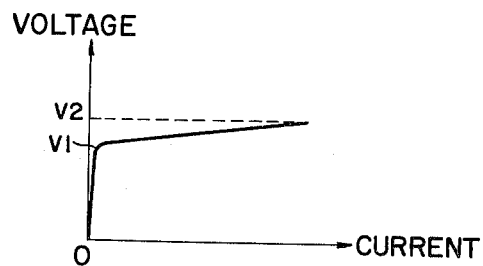
FIG. 5 is a graph showing the voltage-current characteristic of a non-linear resistor utilized in this invention.

Referring now to FIG. 4 showing a preferred embodiment of this invention, a non-linear resistor NR having a voltage-current characteristic as shown in FIG. 5 is connected across each thyristor v, and an arrestor $A_{rv}$ is connected across each thyristor v via a reactor BL which has a linear characteristic, that is does not saturate so as to uniformly share an incoming surge among respective thyristors. Three branch circuits each including two serially connected thyristors v are connected in parallel across the DC lines to form a bridge rectifier. Considering the insulation coordination of this rectifier, the maximum voltage $v_1$ that can be continuously applied across the non-linear resistor NR and the limiting voltage $v_2$ appearing at the time of impressing an overvoltage across the non-linear resistor NR are set to values as shown in FIG. 2B. Thus, the limiting voltage $v_2$ is set to a value lower than the protective level vp of the arrestor $A_{rv}$ and a margin $k_{14}$ is left between the maximum voltage $v_1$ and the maximum operating voltage vo, this margin being established for the purpose of enabling continuous operation of the converter even when some of the serially connected thyristors become out of order or short circuited as will be described later.

Figure 6:
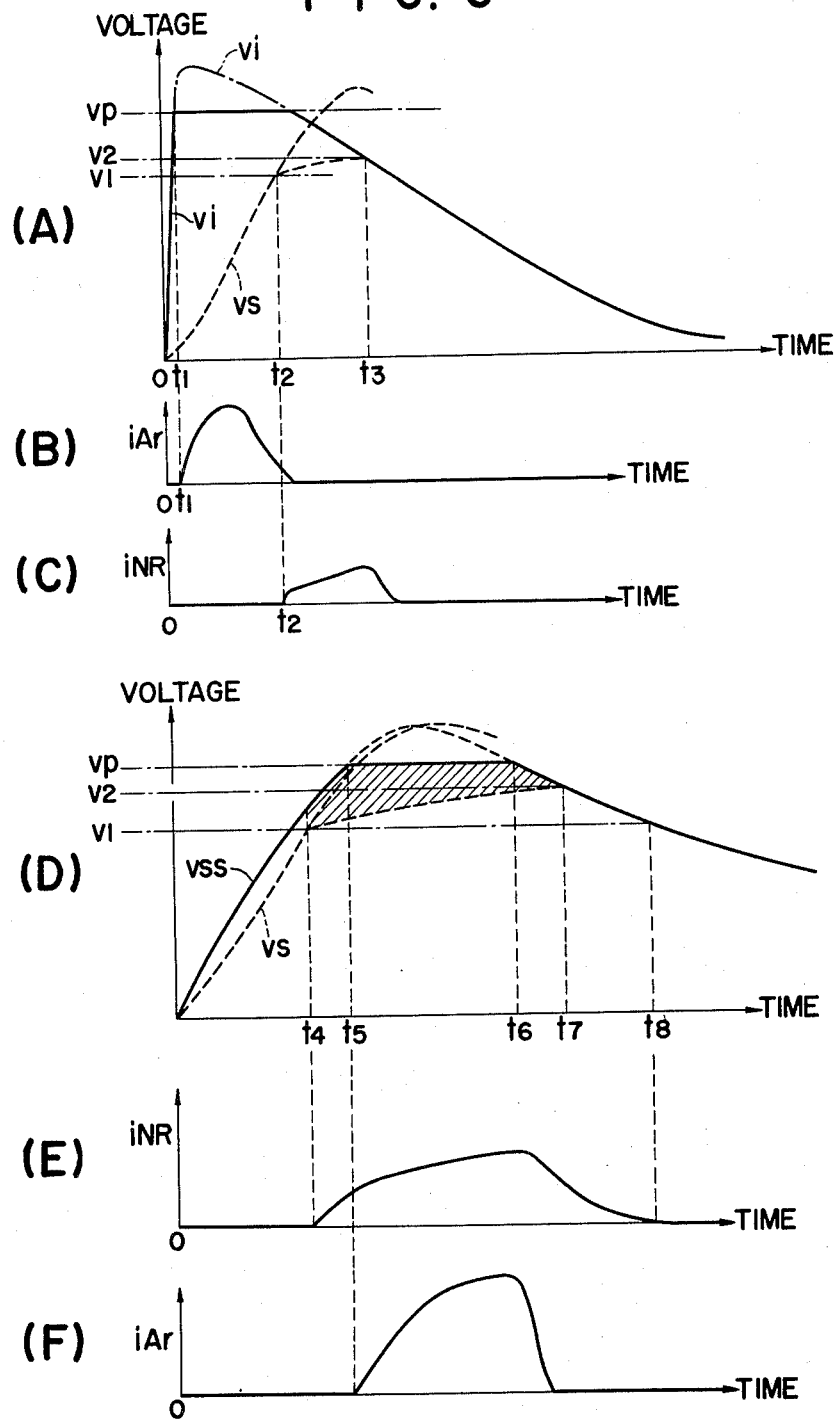
FIGS. 6A through 6F are characteristic curves useful to explain the operation of the overvoltage protective device of this invention.

The protective operation of the thyristor converter which is performed when an overvoltage is impressed across a certain thyristor through reactor BL will now be described with reference to FIGS. 6A through 6F in which FIGS. 6A through 6C show a case where relatively steep impulse voltage, for example 1×40 μs, is applied, whereas FIGS. 6D through 6F show a case where a switching surge, for example 100–200×2,500 μs is applied.

In the case shown in FIGS. 6A through 6C where an impulse voltage vi is impressed, the voltage vs impressed across the thyristor builds up slowly due to the inductance of reactor BL. Even in the worst case, arrester $A_{rv}$ operates at time $t_1$ so as to limit the impulse voltage vi to the protective level of the arrester. At time $t_2$ current begins to flow through the non-linear resistor NR to limit voltage vs to $v_2$. The difference between voltage vs and the protective level vp is shared by reactor BL, and voltages vs and vi will come to coincide with each other at time $t_3$ thus rapidly decreasing the current iNR flowing through the non-linear resistor NR. Thus, with this arrangement there is no fear that the voltage across the thyristor exceeds the limit voltage $v_2$ and since the current is shared between the arrester $A_{rv}$ and the non-linear resistor NR it is possible to limit the current iNR flowing through the non-linear resistor below a permissible voltage by the action of reactor BL. The arrester current $iA_r$ is shown by FIG. 6B.

On the other hand, in the case shown in FIGS. 6D through 6F, since the incoming voltage vss builds up slowly the voltage impressed across the thyristor v closely follows the incoming voltage vss, and at time $t_4$ current iNR begins to flow through the non-linear resistor NR prior to the operation of the arrester $A_{rv}$. A voltage BL·(diNR/dt) (where BL represents the reactance of the reactor) is impressed across the reactor BL and the incomming voltage vss is shared between the thyristor v and the reactor BL according to an equation:

$$vss = vs + BL \cdot \frac{diNR}{dt}$$

At time $t_5$, the incoming voltage vss reaches the protective level vp so as to limit the incomming voltage to this level vp until time $t_6$ is reached. Meanwhile, the current iNR flowing through the non-linear resistor NR continues to increase until time $t_7$ and thereafter decreases to zero at time $t_8$. Thus, the relative characteristics of reactor BL and non-linear resistor NR are determined such that the limiting voltage becomes $v_2$ at time $t_7$. In the case shown in FIGS. 6D through 6F the stress of the non-linear resistor is larger than the case shown in FIGS. 6A–6C. Accordingly, the value of reactor is determined for the case of FIGS. 6D through 6F by taking into consideration the values of $v_2$ and iNR. With this arrangement it is possible to decrease the base voltage utilized to determine the number of the thyristors to be connected in series to $v_2$ from vt in equation 1.

FIG. 7 shows one example of the connection of each thyristor group. As shown, a number of thyristors $S_1$, $S_2$, ... $S_n$ are connected in series and respectively shunted by non-linear resistors $NR_1$, $NR_2$, ... $NR_n$, and voltage dividing elements $CG_1$ and $RG_1$, $CG_2$ and $RG_2$ ... $CG_n$ and $RG_n$. A reactor BL is connected in series with the thyristor group and an arrestor $A_{rv}$ is connected to the input side of reactor BL. The continuous permissible voltage and the sum of the limiting voltages of non-linear resistors $NR_1$–$NR_n$ are selected to be $v_1$ and $v_2$ respectively. With this connection, the unbalance between the shares of the surge voltage caused by stray capacitances $C_{g1}$ through $C_{gn}$ is improved as shown in FIGS. 8A and 8B by the action of the non-linear characteristics of the non-linear resistors. Thus, in accordance with this invention, voltage share can be improved without using any capacitor corresponding to capacitors $C_s$ shown in FIG. 3. Accordingly, it is possible to completely eliminate the problem of increasing the turn on stress due to capacitances $C_s$ and the problem of increasing the capacity of the damping circuit CD-RD. Furthermore, according to this invention, where surge voltage is impressed across a thyristor group under a condition in which some of the thyristors are short circuited, the increment in the stress of the sound thyristors is small because it is absorbed by the non-linear resistors NR. While the permissible number of the short circuited thyristors is determined by a condition under which the voltages across the non-linear resistors do not exceed their permissible values under the maximum operating voltage $v_o$, it is possible to sufficiently equalize the voltage shares under normal condition by the provision of voltage division circuits $CG_1$-$RG_1$ ... $CG_n$-$RG_n$ thereby increasing the margin than the margin $k_2$ of the prior art construction.

Figure 10:
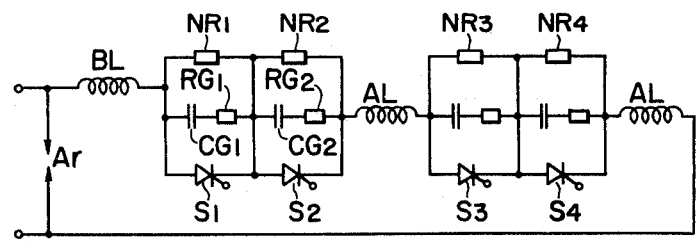
Figure 11:
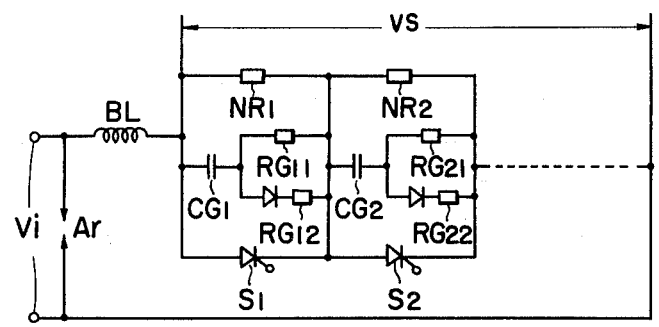

FIGS. 9 through 11 are modified embodiments of this invention respectively showing a group of thyristors corresponding to that shown in FIG. 7. In FIG. 9, each of the non-linear resistors $NR_1$ and $NR_2$ is connected in parallel with each thyristor group, whereas in FIG. 10, an anode reactor AL is connected between adjacent thyristor groups. According to this modification, it is possible to decrease the reactance of reactor BL by the reactances of the anode reactors. In FIG. 11, the values of the voltage division circuits (CG-RD) are varied in accordance with the polarity of the surge voltage for decreasing the rate of change (dv/dt) of the voltage across the thyristor when a surge voltage having a positive polarity arrives. Since the thyristor's forward blocking voltage is affected by the (dv/dt), the blocking voltage for the negative polarity is much larger than that for the positive polarity. The relative values of the resistors $RG_{11}$, $RG_{12}$, $RG_{21}$ and $RG_{22}$ are selected to satisfy the relations of $RG_{11} > RG_{12}$ and $RG_{21} > RG_{22}$ . . . so as to render the circuit BL-$CG_1$-$RG_{11}$ to be non-oscillatory for the negative polarity whereas the circuit BL-CG-$RG_{12}$ becomes oscillatory for the positive polarity.

Figure 12:
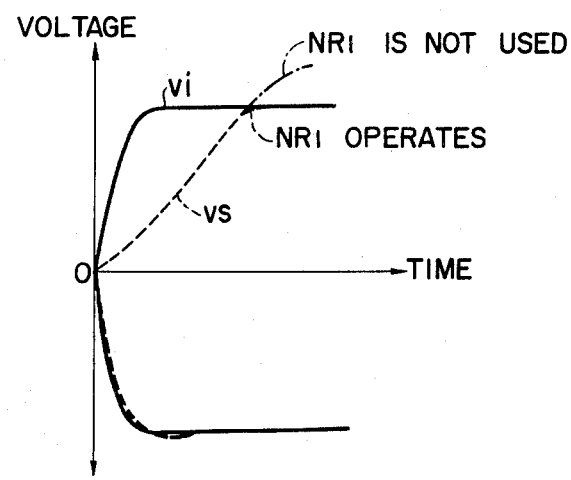
FIG. 12 is a graph useful to explain the operation of the embodiment of this invention.

More particularly, as shown in FIG. 12, for the positive polarity the value of resistors $RG_{12}$ . . . are selected to be small so as to alleviate the build-up rate of the voltage across the thyristor and to absorb the overshooting portion of the voltage by the non-linear resistor.

Summarizing the above, this invention has the following advantages.

1. It is possible to reduce the number of thyristors connected in series.

2. It is possible to eliminate the capacitor which has been used for the purpose of improving the share of surge voltage. Accordingly, it is possible to decrease the rating of the anode reactor and damping circuit.

3. It is possible to decrease the power loss of the thyristor.

4. It is possible to improve the reliability and decrease the cost.

While in the foregoing description, the semiconductor power converting device was described in terms of a rectifier it should be understood that the invention is also applicable to semiconductor inverters.

We claim:

1. An electric power converting apparatus comprising:
a plurality of parallelly connected branches, a plurality of linear reactors each connected in series with one of said branches, and a plurality of arrestors each connected in parallel with a series connection of a linear reactor and a branch, each branch including a plurality of serially connected semiconductor switching elements, a plurality of non-linear resistors each connected in parallel with one or more of said semiconductor switching elements, a voltage division element including a serially connected capacitor and resistor connected in parallel with each semiconductor switching element and anode reactors connected in series with said semiconductor switching elements, each of the non-linear resistors of a branch providing a limiting voltage, and the sum of the limiting voltages being lower than the protective level of an arrestor connected in parallel with a serially connected linear reactor and a branch.

2. The electric power converting apparatus according to claim 1 wherein the sum of the limiting voltages provided by the non-linear resistors is lower than the protective level of said arrestor.

3. The electric power converting apparatus according to claim 1 wherein the resistance of the voltage division element is varied in accordance with the polarity of the overvoltage impressed across the semiconductor switching element.

4. The electric power converting apparatus according to claim 1 wherein said non-linear resistor is connected in parallel with each semiconductor switching element.

5. The electric power converting apparatus according to claim 1 wherein said serially connected semiconductor switching elements are divided into a plurality of groups and said non-linear resistor is connected in parallel with each group.

6. The electric power converting apparatus according to claim 1 wherein said serially connected semiconductor switching elements are divided into a plurality of groups, and anode reactors are interposed between adjacent groups.

7. The electric power converting apparatus according to claim 1 wherein the value of said resistor of the voltage division element is selected according to the polarity of surge voltage impressed upon said electric power converting apparatus.

* * * * *